(12) United States Patent
Harvey

(10) Patent No.: US 6,201,420 B1
(45) Date of Patent: Mar. 13, 2001

(54) ELECTRONIC DRIVER CIRCUIT THAT UTILIZES RESONANCE WITH LOAD CIRCUITRY IN COMBINATION WITH TIMED SWITCHING TO REDUCE POWER CONSUMPTION

(76) Inventor: Geoffrey P. Harvey, 20 Church Lane, Little Abington, Cambridge, CB1 6BQ (GB)

( * ) Notice: Subject to any disclaimer, the term of this patent is extended or adjusted under 35 U.S.C. 154(b) by 0 days.

(21) Appl. No.: 09/498,408

(22) Filed: Feb. 4, 2000

Related U.S. Application Data

(63) Continuation of application No. 09/029,707, filed as application No. PCT/GB96/02199 on Sep. 6, 1996.

(30) Foreign Application Priority Data

Sep. 6, 1995 (GB) .................................................. 9518143

(51) Int. Cl.[7] .................................................. H03B 1/00
(52) U.S. Cl. .......................................... 327/109; 327/112
(58) Field of Search ..................................... 327/108, 109, 327/110, 111, 112; 326/56, 57, 58, 85, 87, 91

(56) References Cited

U.S. PATENT DOCUMENTS

| | | | |
|---|---|---|---|
| 4,654,605 | * | 3/1987 | Lehmann et al. ........................ 331/55 |
| 5,036,222 | * | 7/1991 | Davis .................................... 307/443 |
| 5,373,199 | * | 12/1994 | Shichinohe et al. ................. 327/328 |
| 5,734,285 | * | 3/1998 | Harvey ................................... 327/291 |

FOREIGN PATENT DOCUMENTS

| | | |
|---|---|---|
| 0 271 331 A2 | * 6/1988 | (EP) . |
| 0 459 457 A2 | * 12/1991 | (EP) . |
| 0 668 593 A1 | * 8/1995 | (EP) . |
| 2 270 221 | * 3/1994 | (GB) . |

OTHER PUBLICATIONS

Wyatt, "Reactive CCD drive saves power," *EDN*, Jan. 19, 1989, pp. 206–211.*

* cited by examiner

*Primary Examiner*—Jeffrey Zweizig
(74) *Attorney, Agent, or Firm*—Klarquist Sparkman Campbell Leigh & Whinston, LLP

(57) ABSTRACT

A driver circuit (18) generates a circuit output signal ($V_{DO}$) which is provided to an electrical conductor (12) that furnishes a conductor output signal ($V_{BO}$) to a load (14). The circuit and conductor output signals make corresponding circuit and conductor output transitions approximately between a pair of output voltage levels ($V_{SS}$ and $V_{DD}$) between which there is an intermediate voltage level ($V_{HH}$). Inductance (LB) and capacitance (CB and CL) of the conductor and load produce resonance that enables the conductor output signal to largely complete each conductor output transition while the circuit output signal is being held at or close to the intermediate voltage level for a short period. The circuit output signal rapidly completes each circuit output transition after the intermediate-level holding period is over. By operating in this manner, energy is re-used in a resonant manner, thereby substantially reducing power consumption.

26 Claims, 7 Drawing Sheets

ELECTRONIC DRIVER CIRCUIT THAT UTILIZES RESONANCE WITH LOAD CIRCUITRY IN COMBINATION WITH TIMED SWITCHING TO REDUCE POWER CONSUMPTION

CROSS-REFERENCE TO RELATED APPLICATIONS

This is a continuation of U.S. patent application Ser. No. 09/029,707, filed Mar. 6, 1998, which corresponds to, and claims benefit of, International Application PCT/GB96/02199, filed Sep. 6, 1996.

FIELD OF USE

This invention relates to electronic circuits. In particular, this invention relates to reducing power consumption in electronic circuits and conditioning signals in electronic circuits.

BACKGROUND ART

An electronic circuit consumes power in various ways. For example, power is consumed when input signals to elements of the circuit change state. The power consumption occurs as the result of the charging and discharging of parasitic capacitances associated with the inputs to the circuit elements and with electrical conductors that provide the input signals to circuit elements. Power dissipation does not occur in the parasitic capacitance associated with a signal, but in the output resistance of the driver circuit which is the source of the signal.

A large portion of the power consumption in a modern integrated circuit ("IC") occurs in the signal drivers which drive the output pins of the IC and thus also the inputs to any other circuits or ICs connected to the output pins, typically by way of electrically conductive tracks formed on a printed wiring board ("PWB"). The parasitic capacitance associated with (i.e., driven by) each output signal driver is typically much higher than that associated with the internal signals within the IC. Consequently, the power dissipation is high.

A further problem associated with the output drivers of an IC results from the fact that the associated wiring, both within the IC package and on the PWB, is relatively long and therefore has high inductance. This inductance commonly causes undesirable signal characteristics such as "ringing" and "overshoot".

Referring to the drawings, FIG. 1a illustrates a conventional CMOS inverting output driver 10 formed as part of an IC. Output driver 10 generates an inverted driver output voltage signal $V_{DO}$ in response to a driver input voltage signal $V_I$. Driver 10 is connected through electrical conductor 12 of a PWB to load circuitry 14. Specifically, electrical conductor 12 converts driver output voltage $V_{DO}$) into a conductor output voltage signal $V_{BO}$ that drives a group of digital CMOS ICs 16 in load 14.

Driver circuit 10 is formed with N-channel insulated-gate field-effect transistor ("FET") QA and P-channel insulated-gate FET QB whose gate electrodes receive driver input voltage $V_I$. The sources of FET QA and QB are respectively connected to a source of a low supply voltage $V_{SS}$, typically ground reference (0 volt), and a source of a high supply voltage $V_{DD}$. The QA and QB drains are connected together to provide driver output voltage $V_{DO}$.

N-channel FET QA is turned on by raising input voltage $V_I$ to a suitably high level. On the other hand, FET QB is turned on by reducing voltage $V_I$ to a suitably low level. Accordingly, only one of FETs QA and QB is conductive during steady-state operation. If input voltage $V_I$ is high, FET QA is turned on to pull output voltage $V_{DO}$ to a low value close to $V_{SS}$. Conversely, output voltage $V_{DO}$ is at a high value close to $V_{DD}$ when input voltage $V_I$ is low and causes FET QB to be turned on.

The "on" resistance of each of FETs QA and QB is normally quite low. Consequently, output voltage $V_{DO}$ makes a rapid transition from $V_{SS}$ to $V_{DD}$ when input voltage $V_I$ makes a high-to-low transition. Likewise, output voltage $V_{DD}$ makes a rapid transition from $V_{DD}$ to $V_{SS}$ when input voltage makes a low-to-high transition. During a transition, there is typically a brief period when both of FETs QA and QB are conductive.

PWB electrical conductor 12, commonly referred to as an interconnect, consists of a length of copper track and a ground plane at the $V_{SS}$ potential. The steps shown in the line passing through conductor 12 in FIG. 1a qualitatively represent the changes in direction that conductor 12 makes on the PWB. The ground plane is represented by the block in slanted shading. CMOS ICs 16 in load 14 are also variously connected to the $V_{SS}$ supply.

FIG. 1a does not explicitly show the various parasitic circuit elements which typically exist in any such circuit arrangement. For example, PWB conductor 12 is typically inductive and is also coupled to the nearby ground plane by parasitic capacitance. When driver 10 is formed as part of an IC within an IC package, the conductors internal to the package introduce further parasitic inductance and capacitance. Likewise, when ICs 16 are contained within IC packages, ICs 16 introduce further parasitic inductance and capacitance.

FIG. 1b shows a simplified electrical model of the circuitry in FIG. 1a. Inverting driver 10 is modeled by a switch SW in series with an output resistor $R_{ON}$. Switch SW is controlled by input voltage $V_I$. Resistor $R_{ON}$ represents the source-drain resistance of each FET QA or QB when it is turned on. PWB conductor 12 is modeled by parasitic inductance LB with distributed parasitic capacitance CB. Inductance LB and capacitance CB also model the parasitic inductance and capacitance of conductors internal to IC packages when driver 10 is formed as part of an IC contained in an IC package and/or when ICs 16 are contained within IC packages. Load 14 is modeled by parasitic capacitance CL representing the combined capacitances of the inputs to ICs 16 in load 14.

Consider a typical case in which conductor capacitance CB is much less than load capacitance CL. When input voltage $V_I$ causes switch SW of FIG. 1b to change state, output voltages $V_{DO}$ and $V_{BO}$ change in the manner generally illustrated by the waveforms of FIGS. 2a–2c. Since capacitance CB is much less than capacitance CL, the combination $R_{ON}$, CL, CB, and LB approximates a series LC resonant circuit which can be (a) underdamped, (b) critically damped, or (c) overdamped according to the value of on resistance $R_{ON}$ compared to the reactance of inductance LB.

The waveforms shown in FIG. 2a correspond to the underdamped case in which resistance $R_{ON}$ is very low. FIG. 2a illustrates how output voltages $V_{DO}$ and $V_{BO}$ generally vary when input voltage $V_I$ makes a high-to-low transition. Driver output voltage $V_{DO}$ rises quickly from $V_{SS}$ to $V_{DD}$. The effect of conductor inductance LB is to limit the initial flow of current from driver 10. Consequently, conductor output voltage $V_{BO}$ changes slowly at first. However, once current has started flowing through inductance LB, the current continues to flow even when conductor output voltage $V_{BO}$ has reached $V_{DD}$. This leads to overshoot in conductor output voltage $V_{BO}$ and consequent ringing.

FIG. 2b shows waveforms generally representative of the critically damped case in which resistance $R_{ON}$ is moderately (but not very) low. The behavior is similar to the underdamped case except that just enough energy is dissipated in resistance $R_{ON}$ so that there is little overshoot in conductor output voltage $V_{BO}$, substantially no ringing, and the transition speed for both of output voltages $V_{BO}$ and $V_{DO}$ is moderately high.

FIG. 2c shows waveforms corresponding to the overdamped case where resistance $R_{ON}$ is relatively high. Here, the transition speed for both of output voltages $V_{DO}$ and $V_{BO}$ is low. In particular, conductor output voltage $V_{BO}$ takes a comparatively long time to reach the desired $V_{DD}$ level.

Both overshoot and low transition speed are generally undesirable signal characteristics. Consequently, the waveforms shown in FIG. 2b often represent the best case for conventional driver 10. For any of the circuit behaviors depicted in FIGS. 2a–2c, the ringing frequency, the transition speed, and the degree of overshoot depend on the values of elements $R_{ON}$, LB, CB, and CL. While the value of on resistance $R_{ON}$ can be controlled during driver design, the values of elements LB, CB, and CL vary from one PWB conductor to another and from one load to another, making it very difficult to achieve the often desired waveforms of FIG. 2b in the typical case where driver design is completed without knowledge of the specific load characteristics.

The energy drawn from the $V_{DD}$ power supply approximately equals $CV^2$, where V is the potential difference $V_{DD}-V_{SS}$, and C is the sum of capacitances CB and CL. Approximately half the supplied energy—i.e., $\frac{1}{2}CV^2$—is stored in load capacitance CL. The remainder of the supplied energy—i.e., also approximately $\frac{1}{2}CV^2$—is dissipated in on resistance $R_{ON}$.

Similar waveforms occur when input voltage $V_I$ makes a low-to-high transition, causing output voltages $V_{DO}$ and $V_{BO}$ to make high-to-low transitions. In this case, no energy is drawn from the $V_{DD}$ supply. However, the energy stored in load capacitance CL is substantially dissipated. Accordingly, the average power drawn from the $V_{DD}$ supply when input voltage $V_I$ makes transitions at an input frequency $f_I$ is $f_I CV^2$. The majority of the power is dissipated in driver output resistance $R_{ON}$. The load itself typically contains relatively insignificant loss mechanisms.

In the case where on resistance $R_{ON}$ is very low, only a small amount of power dissipation occurs during the initial output transition. Unfortunately, the ringing persists for a relatively long time. Power is gradually dissipated in driver output resistance RON, causing the amplitude of the ringing to decay gradually. This is quite wasteful of power. It is desirable to reduce the power consumption in a driver circuit without sacrificing other desirable performance characteristics and without reducing the capability to accept loads of greatly varying types.

GENERAL DISCLOSURE OF THE INVENTION

The present invention furnishes a split-level technique for reducing power consumption in an electronic driver circuit. By enabling the output signal of the driver circuit to be switched in a timely manner to an intermediate voltage level between the two extreme voltage levels of the driver output signal, the split-level technique of the invention harnesses the natural resonance of inductive/capacitive load circuitry as an energy-storage mechanism that assists in driving the load. The energy stored in the resonance-produced energy storage mechanism is re-used, thereby reducing power consumption in the driver. Up to 75% savings in power consumption can readily be achieved.

Re-use of the stored energy serves to reduce ringing that could otherwise occur in the driver output waveforms. Consequently, signal integrity is improved.

The present invention also furnishes a self-adjusting technique in which the driver circuit automatically adjusts its timing according to different load characteristics. The driver circuit of the invention can thus be utilized in IC designs having a wide variety of load characteristics. The self-adjustment technique also allows driver output transitions to occur at a largely optimal high speed while still avoiding overshoot and undershoot. Hence, the invention provides a large advance over the prior art.

More particularly, a driver circuit configured in accordance with the invention generates a circuit output signal which is typically provided to an electrical conductor that furnishes a conductor output signal provided to a load. The circuit and conductor output signals respectively make corresponding transitions between a pair of output voltage levels. The conductor and load have inductance and capacitance which, in the absence of the invention, could cause the conductor output signal to overshoot during the transition from one of the output levels to the other output level.

The invention avoids the overshoot by utilizing an intermediate voltage level between the two output levels. During the course of a circuit output transition, the driver circuit of the invention holds the circuit output signal approximately at the intermediate voltage level for a non-zero holding period. During the holding period, resistive losses within the driver circuit due to the current of the driver output signal are kept low. Simultaneously, underdamped resonance produced by the inductance and capacitance of the conductor and the load cause the conductor output signal, which is the signal of interest insofar as the load is concerned, to overshoot the intermediate voltage level and end up approximately at the desired final output level. In essence, the voltage overshoot in the present driver circuit starts and ends at earlier points than in a prior art driver that exhibits overshoot, the ending point in the invention being controlled so that the conductor output signal approximately reaches, but does not go significantly beyond, the desired final output voltage level.

When the holding period is over, the circuit output signal goes rapidly to the desired final output voltage level. This causes the conductor output signal to be held at the desired final output voltage level without significant ringing.

A mechanical analogy is helpful in understanding how the present driver circuit re-uses energy which, in the absence of the invention, would be dissipated. The conductor has an inductance L which acts like a flywheel that stores energy $E_I$:

$$E_I = \frac{1}{2} L I_c^2$$

where $I_c$ is the conductor current. During the first half of a conductor output transition from a low voltage level to a high voltage level, current and therefore energy are supplied from the source of the intermediate supply voltage. Approximately half of this energy charges the load capacitance and, because resistive energy loss is kept low, a large part of the remaining energy is stored in the inductive flywheel. Only a relatively small amount of energy is dissipated.

During the second half of the conductor output transition, energy stored in the inductive flywheel is added to further energy supplied from the source of the intermediate supply voltage to enable the conductor output signal to substantially overshoot the intermediate voltage level. Thus, a large part of the energy supplied from the source of the intermediate voltage supply is used to charge the load capacitance with a very low resistive energy loss.

During the next conductor output transition in which the conductor output signal is returned to the low voltage level, the inductive flywheel works in reverse to return a large part of the energy stored in the load capacitance to the source of intermediate voltage supply with a low resistive energy loss. Consequently, over a complete operational cycle, only a small amount of energy is dissipated compared to what occurs with a conventional driver.

The driver circuit of the invention contains control circuitry and switching circuitry. The control circuitry normally generates a plurality of control signals in response to the circuit input signal. The switching circuitry then generates the circuit output signal in response to the control signals.

The present driver circuit is normally coupled between sources of first, second, and third supply voltages respectively equal to one of the output voltage levels, the intermediate voltage level, and the other output voltage level. The switching circuitry typically contains three switches.

One of the switches has a first flow electrode coupled to the source of the first supply voltage, a second flow electrode coupled to an output node from which the circuit output signal is provided, and a control electrode responsive to one of the control signals for controlling current flow between the flow electrodes. Another of the switches has a first flow electrode coupled to the source of the second supply voltage, a second flow electrode coupled to the output node, and a control electrode responsive to another of the control signals for controlling current flow between that switch's flow electrodes. The third switch has a first flow electrode coupled to the source of the third supply voltage, a second flow electrode coupled to the output node, and a control electrode responsive to a third of the control signals for controlling current flow between the third switch's flow electrodes.

The second switch typically has an on resistance of sufficiently low value that, over a wide range of inductive-capacitive load characteristics, transitions of the conductor output voltage are substantially underdamped relative to the intermediate voltage level. Operation of the present driver circuit is relatively insensitive to the on resistances of the first and third switches. The on resistances of the first and third switches are typically chosen such that, in the absence of the second switch, the conductor output transitions would be critically damped relative to the two (extreme) output voltage levels for average load characteristics. Nonetheless, the on resistances of the first and third switches could be chosen so that, again in the absence of the second switch, the conductor output transitions would be overdamped or underdamped relative to the output voltage levels for an average load. The on resistance of the second switch is typically less than half the on resistance of the first switch.

The control circuitry preferably adjusts the intermediate-level holding period dependent on when the circuit output signal substantially completes a circuit output transition compared to when the second control signal substantially completes a corresponding control transition. This self-adjusting capability enables the driver circuit of the invention to be employed with loads having a wide variety of different capacitive and inductive characteristics. The self-adjustment capability can, for example, be achieved by implementing the control circuitry with time-comparison circuitry and adjustment circuitry. The time-comparison circuitry makes comparisons between the circuit output signal and the second control signal. The adjustment circuitry adjusts the intermediate-level holding period depending on the results of the comparisons. The self-adjustment capability enables conductor output transitions to occur at largely optimal high speed without ringing.

Opposite circuit output transitions cause largely equal, but opposite, current flows from the source of the second (intermediate) supply voltage. Thus the net current flow over a complete operational cycle is nearly zero. This allows the intermediate supply voltage to be provided by a reservoir capacitor rather than a power supply.

BRIEF DESCRIPTION OF THE DRAWINGS

FIGSs. 1a and 1b respectively are a circuit diagram and a simplified electrical model of a conventional driver circuit that drives a load through an electrical conductor of a printed wiring board.

Figure 1A:
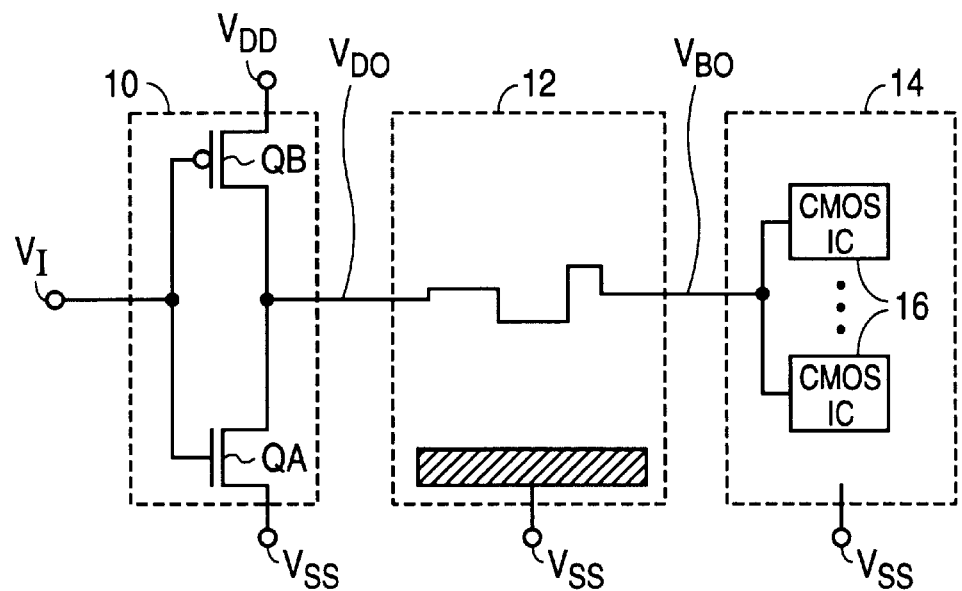

Like reference signals are employed in the drawings and in the description of the preferred embodiments to represent the same, or very similar, item or items.

DESCRIPTION OF THE PREFERRED EMBODIMENTS

Figure 1B:
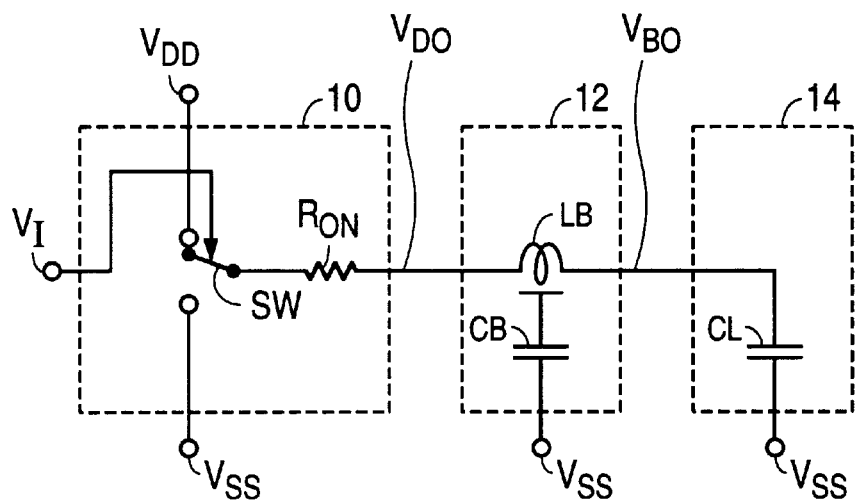
Figure 2A:
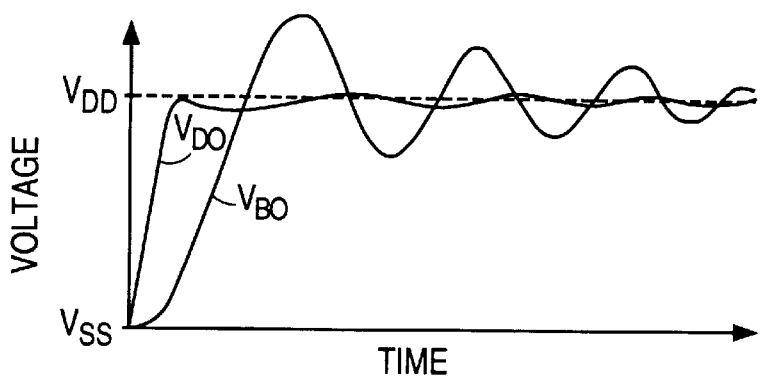
FIGS. 2a, 2b, and 2c are simplified timing diagram graphs of voltage waveforms that arise in the circuitry of FIGS. 1a and 1b when the load in combination with the conductor and driver output resistance respectively approximate underdamped, critically damped, and overdamped series LC resonant circuits.
Figure 2B:
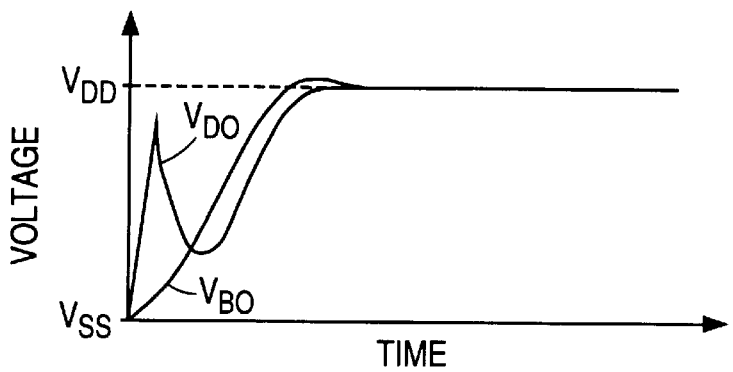
Figure 2C:
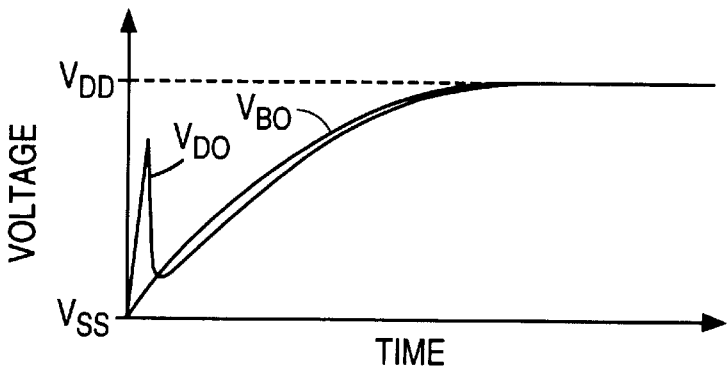
Figure 3:
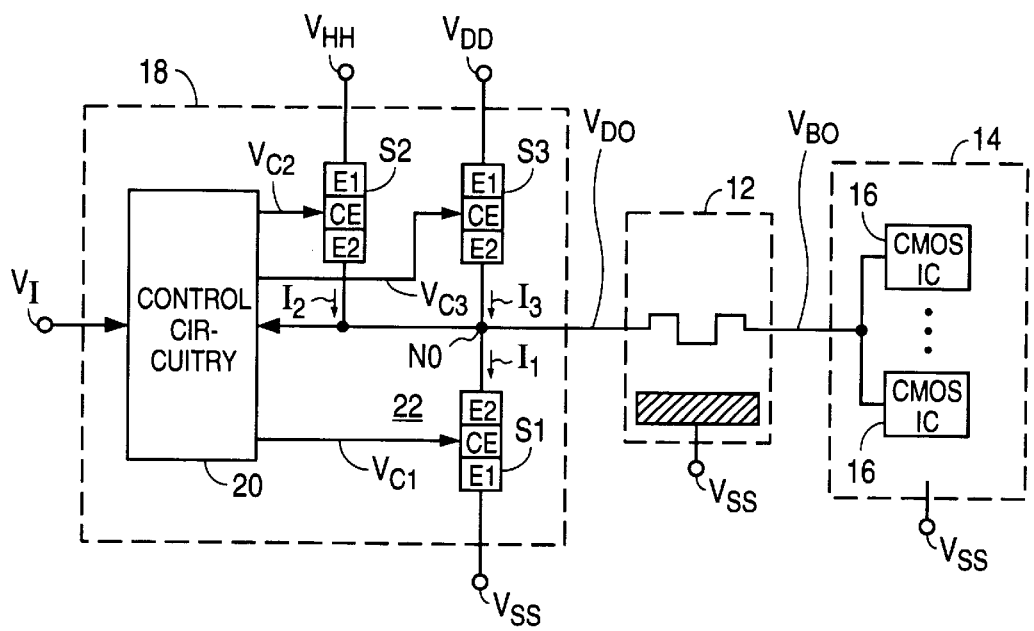
FIG. 3 is a block diagram of circuitry that contains a driver circuit which utilizes resonance to assist in making output transitions according to the invention.

Referring to FIG. 3, it illustrates how a driver circuit 18 is configured in accordance with the teachings of the invention for reducing power consumption in driving load circuitry 14 through electrical conductor 12 formed on a PWB. Conductor 12 and load 14 are typically configured in the manner described above in connection with FIG. 1. The slanted shading in conductor 12 of FIG. 3 again indicates the ground plane maintained at low supply voltage $V_{SS}$. Load 14 again contains digital CMOS ICs 16.

Conductor voltage output signal $V_{BO}$, which drives ICs 16, is supplied from one end of conductor 12 in response to driver output voltage signal $V_{DO}$ supplied to the other end of conductor 12. Conductor output voltage $V_{BO}$ makes conductor output transitions between low supply voltage $V_{SS}$ and high supply voltage $V_{DD}$.

Driver circuit 18 is connected between the $V_{SS}$ and $V_{DD}$ supplies. Low supply voltage $V_{SS}$ again typically is ground reference. Driver circuit 18 is also coupled to a source of an intermediate supply (or reference) voltage $V_{HH}$ that lies between voltages $V_{SS}$ and $V_{DD}$. Intermediate supply voltage $V_{HH}$ is typically halfway between $V_{SS}$ and $V_{DD}$. Instead of being provided from a power supply, intermediate voltage $V_{HH}$ can be provided from a reservoir capacitor as described below in connection with FIG. 9.

Driver 18 generates driver output voltage $V_{DO}$ in response to driver input voltage signal $V_I$. Driver output voltage $V_{DO}$ makes circuit output transitions between $V_{SS}$ and $V_{DD}$. The $V_{DO}$ output transitions follow the $V_I$ input transitions inversely or directly. That is, driver 18 functions as an inverting or non-inverting driver.

Driver circuit 18 is formed with control circuitry 20 and switching circuitry 22. Control circuitry 20 provides control voltage signals $V_{C1}$, $V_{C2}$, and $V_{C3}$ in response to input voltage $V_I$. Control voltages $V_{C1}$, $V_{C2}$, and $V_{C3}$ are also typically generated in response to driver output voltage $V_{DO}$ as a feedback signal. An example of control circuitry 20 is given below in FIG. 8. Switching circuitry 22 generates driver output voltage $V_{DO}$ in response to control voltages $V_{C1}$–$V_{C3}$. Driver output voltage $V_{DO}$ is supplied from a driver output node NO.

Switching circuitry 22 consists of three switching elements (referred to here simply as switches) S1, S2, and S3. Switch S1 has a first flow electrode E1 connected to the $V_{SS}$ supply, a second flow electrode E2 connected to output node NO, and a control electrode CE responsive to control voltage $V_{C1}$ for controlling the current flow between the S1 flow electrodes. Switch S2 has a first flow electrode E1 connected to the $V_{HH}$ supply, a second flow electrode E2 connected to node NO, and a control electrode CE responsive to control voltage $V_{C2}$ for controlling the current flow between the S2 flow electrodes. Switch S3 has a first flow electrode E1 connected to the $V_{DD}$ supply, a second flow electrode E2 connected to node NO, and a control electrode CE responsive to control voltage $V_{C3}$ for controlling the current flow between the S3 flow electrodes.

Each of switches S1–S3 has a low on resistance. In particular, switches S1 and S3 have moderately low on resistances such that, in the absence of switch S2, transitions of conductor output voltage $V_{BO}$ between the $V_{SS}$ and $V_{DD}$ levels would be approximately critically damped for average inductive-capacitive load characteristics. Provided that the on resistances of switches S1 and S3 are sufficiently low to achieve desired switching speed, circuit performance is relatively insensitive to the precise values of the on resistances for switches S1 and S3. Consequently, the on resistances of switches S1 and S3 can be of such values that, in the absence of switch S2, $V_{BO}$ transitions between the $V_{SS}$ and $V_{DD}$ levels would be overdamped or underdamped. Switch S2 has a very low on resistance such that low-to-high transitions in conductor output voltage $V_B$ are underdamped relative to intermediate voltage $V_{HH}$ over a wide range of inductive-capacitive load conditions when switch S3 is closed.

Each of switches S1–S3 (collectively the "S" switches) can be configured in various ways. For example, each of the S switches can consist of a single transistor. In the case of a field-effect transistor of either the insulated-gate or junction type, the two source/drain electrodes of the FET are the first and second flow electrodes while the FET's gate electrode is the control electrode. For a bipolar transistor, its emitter and collector are the flow electrodes while its base is the control electrode.

Each S switch could be formed with multiple transistors in parallel to achieve lower on resistance. The number of transistors in parallel can be controlled by self-adjusting circuitry for adapting to the load characteristics.

Figure 4:
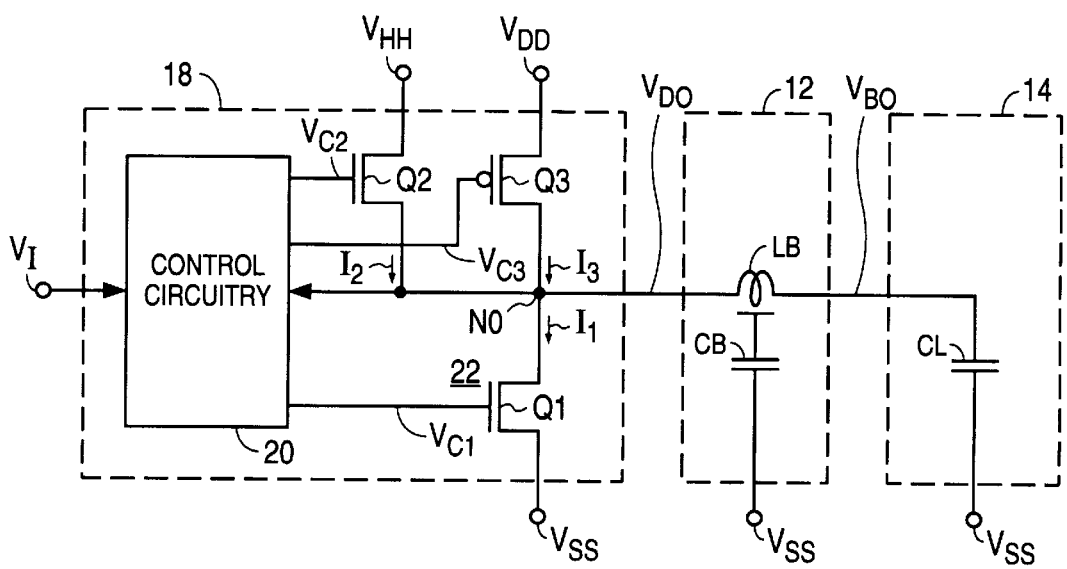
FIG. 4 is a circuit diagram of circuitry containing a CMOS embodiment of the driver circuit in FIG. 3.

FIG. 4 illustrates a CMOS example of the driver circuit of FIG. 3 in which each of the S switches is implemented with an enhancement-mode insulated-gate FET. In particular, switch S1 consists of an N-channel FET Q1 whose source and drain are respectively connected to the $V_{SS}$ supply and output node NO. Switch S2 is formed with another N-channel FET Q2 whose source/drain elements are respectively connected to the $V_{HH}$ supply and node NO. Switch S3 consists of a P-channel FET Q3 whose source and drain are respectively connected to the $V_{DD}$ supply and node NO. Control voltages $V_{C1}$–$V_{C3}$ are respectively supplied to the gate electrodes of FETs Q1–Q3.

FET Q2 could also be a P-channel FET even though the on resistance of a P-channel FET is normally somewhat greater than that of an N-channel FET. In this case, control voltage $V_{C2}$ would typically make transitions opposite to those described below.

As a further alternative, switch S2 could be formed with a P-channel FET whose source/drain elements are respectively connected to the $V_{HH}$ supply and node NO in parallel with an N-channel FET also with source/drain elements connected respectively to the $V_{HH}$ supply and node NO. In this case, control voltage $V_{C2}$ is replaced with a pair of complementary control voltages, one for the gate electrode of each of the P-channel and N-channel FETs in switch S2.

The example in FIG. 4 also illustrates how PWB conductor 12 and load circuitry 14 are modeled for the purpose of analysis. As in FIG. 1, conductor 12 and any conductors internal to associated IC packages—i.e., packages present when driver 18 is formed as part of an IC contained in an IC package and/or when ICs 16 are contained in IC packages—are modeled by inductance LB and distributed capacitance CB connected between inductance LB and the $V_{SS}$ supply. Load 14 is modeled with capacitance CL connected to the $V_{SS}$ supply. To simplify the analysis, conductor capacitance CB can be viewed as part of load capacitance CL. Although the exact distribution of the total load capacitance between capacitances CL and CB affects the $V_{BO}$ waveform shapes, the essential resonant characteristics of the inductive-capacitive loading are present across a wide range in the ratio of capacitance CL to capacitance CB.

Figure 5A:
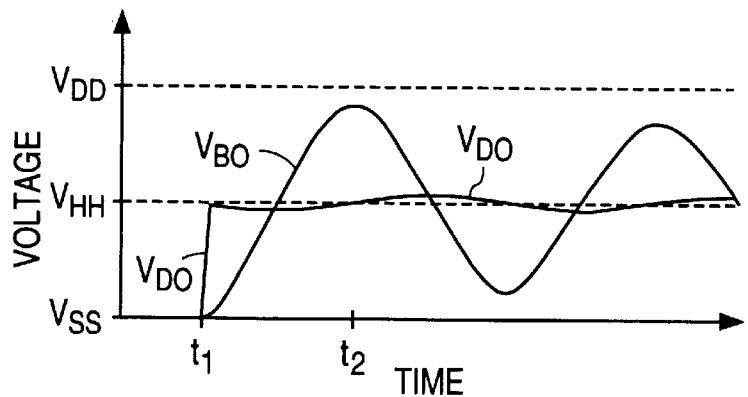
FIGS. 5a and 5b are simplified timing diagrams of respective voltage and current waveforms that would occur in the circuitry of FIGS. 3 and 4 if ringing were permitted to occur.
Figure 5B:
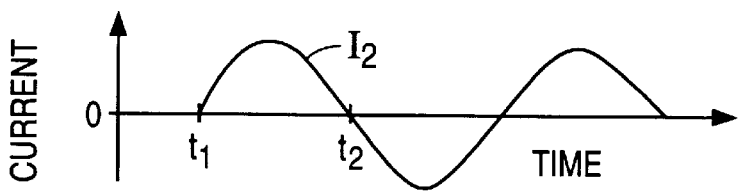
Figure 6:
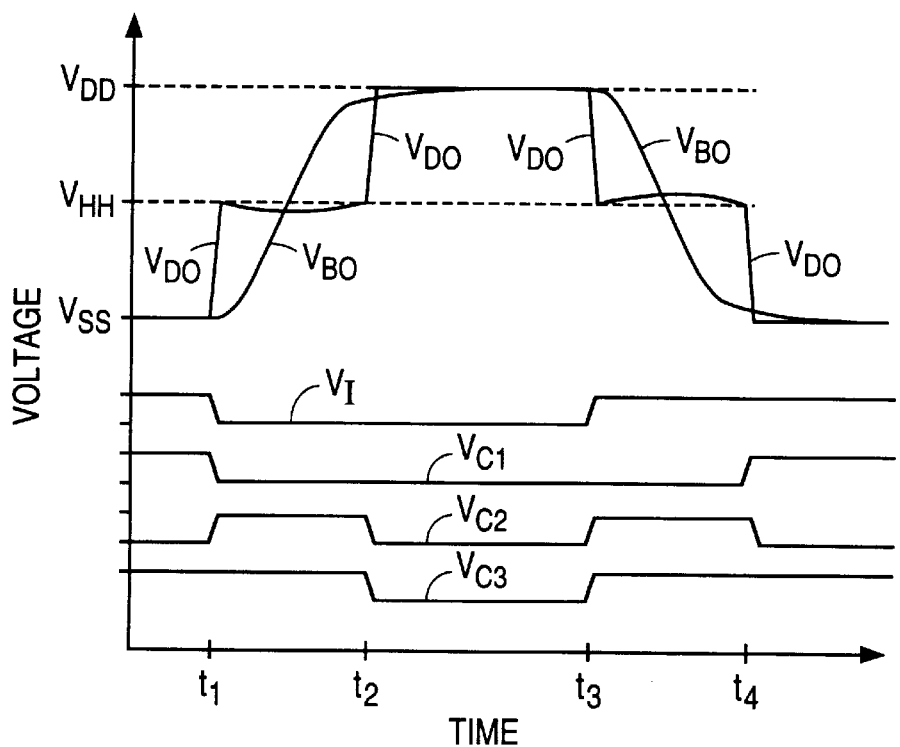
FIG. 6 is a simplified timing diagram of voltage waveforms that arise in the circuitry of FIGS. 3 and 4 when the driver circuit is operated in its intended mode.

The operation of the driver circuit in FIGS. 3 and 4 is now explained using the timing diagrams of FIGS. 5a, 5b, and 6 which apply specifically to the example of FIG. 4. FIG. 5a illustrates how output voltages $V_{DO}$ and $V_{BO}$ would vary if, element S1/Q1 having previously been turned on, is switched off at the same time that element S2/Q2 is switched permanently on, element S3/Q3 being maintained permanently off. FIG. 5b correspondingly illustrates how the S2/Q2 current would vary. The upper waveforms in FIG. 6 illustrate how output voltages $V_{DO}$ and $V_{BO}$ vary when all of elements S1–S3/Q1–Q3 operate in the desired manner. The lower waveforms in FIG. 6 depict the variations of input voltage $V_I$ and control voltages $V_{C1}$–$V_{C3}$.

Assume that input voltage $V_I$ is at such a value that driver output voltage $V_{DO}$ is initially at low value $V_{SS}$. Conductor output voltage $V_{BO}$ is likewise initially at $V_{SS}$. If driver 18 is an inverter, these conditions are achieved by placing input voltage $V_I$ at a high level. This case is illustrated in FIG. 6.

Conversely, input voltage $V_I$ is initially at a low level when driver 18 is a non-inverting circuit.

With driver output voltage $V_{DO}$ at $V_{SS}$ element S1,/Q1 is turned on so as to connect output node NO to the $V_{SS}$ supply. A current $I_1$ flows from node NO through element S1/Q1 to the $V_{SS}$ supply. Current, constitutes any leakage currents through the inputs to CMOS ICs 16 and is normally quite small. When switch S1 is implemented with N-channel FET Q1, control voltage $V_{C1}$ is at a high value close to $V_{DD}$ as shown in FIG. 6.

Elements S2/Q2 and S3/Q3 are initially off. For the case in which switches S2 and S3 are respectively implemented with N-channel FET Q2 and P-channel FET Q3, control voltage $V_{C2}$ is initially at a low value close to $V_{SS}$ while control voltage $V_{C3}$ is at a high value close to $V_{HH}$. Again, see FIG. 6.

Input voltage $V_I$ now goes through a suitable input voltage transition, causing driver output voltage $V_{DO}$ to initiate a low-to-high voltage transition from $V_{SS}$ to $V_{DD}$ at a time $t_1$ as indicated in FIG. 5a. In particular, control voltage $V_{C1}$ makes a transition that causes element S1/Q1 to turn off. When switch S1 is implemented with N-channel FET Q1, control voltage $V_{C1}$ therefore drops to a low value close to $V_{SS}$ as indicated in FIG. 6. Current $I_1$ goes to zero.

Simultaneous with the $V_{C1}$ transition, control voltage $V_{C2}$ makes a transition that causes element S2/Q2 to turn on. A current $I_2$ starts to flow from the $V_{HH}$ supply through element S2/Q2 to output node NO. Driver output voltage $V_{DO}$ rapidly rises to $V_{HH}$. In the case where switch S2 is implemented with N-channel FET Q2, control voltage $V_{C2}$ is raised to a high value close to $V_{DD}$ as shown in FIG. 6. Control voltage $V_{C3}$ remains at its original value for the time being. Element S3/Q3 thus remains off at this stage.

As driver output voltage $V_{DO}$ rises rapidly to $V_{HH}$, conductor output voltage $V_{BO}$ also moves upward. Capacitances CL and CB begin to charge. However, the presence of inductance LB causes conductor output voltage $V_{BO}$ to rise considerably more slowly than driver output voltage $V_{DO}$ as indicated in FIGS. 5a and 6. Due to the very low on-resistance of element S2/Q2 and the inductive effect of inductance LB, conductor output voltage $V_{DO}$ overshoots $V_{HH}$ and reaches a maximum voltage close to $V_{DD}$ at a time $t_2$.

If element S3/Q3 were maintained permanently off and element S2/Q2 were maintained permanently on as represented by the voltage waveforms of FIG. 5a, conductor output voltage $V_{BO}$ would ring approximately sinusoidally with a frequency $f_R$:

$$f_R = 1/2\pi\sqrt{L_B C}$$

where $L_B$ is the value of inductance LB, and C again is the sum of the values of capacitances CL and CB. Current $I_2$ through element S2/Q2 would alternate in direction as depicted in FIG. 5b. Inasmuch as a small amount of power is dissipated in element S2/Q2 and also in the various loss mechanisms associated with load 14, the amplitudes of the $V_{BO}$ and $I_2$ oscillations gradually die out.

A small voltage drop occurs across element S2/Q2. This causes driver output voltage $V_{DO}$ to deviate slightly from $V_{HH}$ in the manner shown in FIGS. 5a and 6.

During the oscillations, energy is continually exchanged in an efficient manner between the $V_{HH}$ supply, load capacitances CL and CB, and inductance LB. When conductor output voltage $V_{BO}$ is at a peak high level, capacitances CL and CB store a maximum of energy. The $V_{HH}$ supply stores a maximum of energy when output voltage $V_{BO}$ is at a peak low level. When output voltage $V_{BO}$ is at the intermediate $V_{HH}$ level, inductance LB stores a maximum of energy.

In the actual operation of the present driver circuitry, the travel of conductor output voltage $V_{BO}$ is arrested when it first reaches a value quite close to $V_{DD}$. This value corresponds approximately to a maximum $V_{BO}$ excursion and is somewhat less than $V_{DD}$ because some energy has been dissipated in various loss mechanisms. The arrest in the $V_{BO}$ travel is performed approximately at time $t_2$ by causing control voltage $V_{C3}$ to make a transition so that element S3/Q3 turns on. A current $I_3$ now begins to flow from the $V_{DD}$ supply through element S3/Q3 to output node No. Control voltage $V_{C2}$ is simultaneously adjusted to a value that causes element S2/Q2 to turn off. Current $I_2$ goes to zero.

The simultaneous changes in control voltages $V_{C2}$ and $V_{C3}$ disconnect output node NO from the intermediate $V_{HH}$ supply and connect node NO to the higher $V_{DD}$ supply. Driver output voltage $V_{DO}$ thus goes rapidly up to $V_{DD}$ as shown in FIG. 6. Capacitances CL and CB are further charged, replenishing energy dissipated by various loss mechanisms. The connection of node NO to the $V_{DD}$ supply holds conductor output voltage $V_{BO}$ at a value close to $V_{DD}$. A small current constituting the leakage currents through inputs to ICs 16 is drawn from the $V_{DD}$ supply. Substantially no ringing occurs in conductor output voltage $V_{BO}$. For the case in which switches S2 and S3 are respectively implemented with N-channel FET Q2 and P-channel FET Q3, control voltages $V_{C2}$ and $V_{C3}$ both drop to a low level close to $V_{SS}$. This completes a first half cycle of the operation of driver 18.

Inductance LB, by acting as a temporary energy storage mechanism during the full $V_{BO}$ transition, allows energy supplied from the $V_{HH}$ supply to charge capacitances CB and CL in a very efficient, substantially non-resistive, non-dissipative manner. Consequently, a large part of the energy supplied by the $V_{HH}$ supply ends up stored in capacitances CL and CB.

Largely the reverse occurs when input voltage $V_I$ makes a transition that causes driver output voltage $V_{DO}$ to initiate a high-to-low output voltage transition from $V_{DD}$ to $V_{SS}$ at a time $t_3$ as indicated in FIG. 6. Control voltage $V_{C3}$ makes a transition that causes element S3/Q3 to turn off. Current $I_3$ goes to zero as output node NO is disconnected from the $V_{DD}$ supply.

Simultaneous with the $V_{C3}$ transition, control voltage $V_{C2}$ makes a transition that causes element S2/Q2 to turn on. Output node No is connected to the $V_{HH}$ supply, thereby enabling current $I_2$ to flow from node NO through element S2/Q2 to the $V_{HH}$ supply. In the second half of a full operational cycle for driver 18, current $I_2$ thus flows in the opposite direction from the first half of the cycle. Driver output voltage $V_{DO}$ drops rapidly to $V_{HH}$.

Similar to what happens in the first half of the operational cycle, conductor output voltage $V_{BO}$ attempts to follow driver output voltage $V_{DO}$ downward. However, the presence of inductance LB causes conductor output voltage $V_{BO}$ to fall considerably slower than driver output voltage $V_{DO}$. Due to the very low on resistance of element S2/Q2 and the inductive effect of inductance LB, conductor output voltage $V_{BO}$ overshoots $V_{HH}$ and reaches a minimum value close to $V_{SS}$ at a time $t_4$.

The travel of conductor output voltage $V_{BO}$ is arrested at time $t_4$ by enabling control voltage $V_{C1}$ to make a transition that causes element S1/Q1 to turn on. Output node NO is then connected to the $V_{SS}$ supply, enabling current $I_1$ to flow from node NO through element S1/Q1 to the $V_{SS}$ supply. A transition in control voltage $V_{C2}$ is simultaneously made that causes element S2/Q2 to turn off, thereby disconnecting node NO from the $V_{HH}$ supply. Current $I_2$ goes to zero. Driver output voltage $V_{DO}$ drops rapidly to $V_{SS}$.

Capacitances CB and CL complete their discharge during which a small amount of residual energy is lost. Inductance LB, by acting as a temporary storage mechanism during the transition, allows energy stored in capacitances CL and CB to be returned to the $V_{HH}$ supply in a very efficient, substantially non-resistive, non-dissipative manner. In particular, a large part of the energy stored by capacitances CL and CB is returned to the $V_{HH}$ supply. Thus, over a complete operational cycle, only a small amount of energy is dissipated. The connection of output node NO to the $V_{SS}$ supply holds connector output voltage $V_{BO}$ at a value close to $V_{SS}$. Again, substantially no ringing occurs in conductor output voltage $V_{BO}$. This completes the second half of the operational cycle.

The transitions in control voltages $V_{C2}$ and $V_{C3}$ during the first half cycle when conductor output voltage $V_{BO}$ first reaches $V_{DD}$ need to be made at a point in time having a relatively small tolerance in order for the inductive/capacitive resonance mechanism to provide power savings. The same applies to the transitions in control voltages $V_{C2}$ and $V_{C1}$ during the second half cycle when conductor output voltage $V_{BO}$ first reaches $V_{SS}$. In other words, the timing sequence produced by control circuitry 20 needs to be quite precise for disconnecting element S2/Q2 at the point of maximum or minimum load voltage.

The timing depends particularly on inductance LB, conductor capacitance CB, and load capacitance CL. Ideally, the timing should be determined from an a priori external examination of conductor output voltage $V_{BO}$. While this can be done when an implementation of driver circuit 18 is developed for a specific application, conductor output voltage $V_{BO}$ is not generally available a priori when driver 18 is developed for general usage. Nonetheless, various techniques can be employed to provide precise adjustment of the control timing to accommodate particular applications.

For example, the point of maximum or minimum load voltage closely corresponds to the point at which current $I_2$ from the $V_{HH}$ supply through element S2/Q2 falls to zero. Therefore, the small voltage drop across element S2/Q2 also drops to zero. Consequently, the voltage drop can be used in conjunction with a voltage comparator to determine when to switch element S2/Q2 off. Since element S2/Q2 has a very low on resistance, the comparator needs high speed and high gain to achieve the desired objective.

Alternatively, control circuitry 20 can directly monitor current $I_2$ to determine when its value reaches zero. Upon determining that current $I_2$ is zero, control circuitry 20 causes element S2/Q2 to turn off.

Another technique for adjusting the timing depends on the fact that the timing, although generally different for each different circuit design, remains substantially constant in any particular application. Therefore, by making driver 18 to be self-adjusting and able to memorize the required timing sequence, the timing sequence can be determined by observing driver output voltage $V_{DO}$ during a driver output transition immediately after element S2/Q2 is turned off.

A fundamental characteristic of an inductor is that it acts to maintain any existing current flowing through it. While element S2/Q2 is conductive, current $I_2$ flows to or from the $V_{HH}$ supply through element S2/Q2 and through inductance LB. When element S2/Q2 is turned off, current continues to flow through inductance LB at substantially the same value of current $I_2$ that existed just before element S2/Q2 was turned off. During the $V_{HH}$-to-$V_{DD}$ part of a $V_{BO}$ output transition, element S3/Q3 is turned on when element S2/Q2 is turned off. During the $V_{HH}$-to-$V_{SS}$ part of the subsequent $V_{BO}$ output transition, element S1/Q1 is turned on when element S2/Q2 is turned off. Since each of elements S1/Q1 and S3/Q3 has a higher on resistance than element S2/Q2, the current flow through inductance LB causes a larger and more easily detected voltage drop across either element S1/Q1 or S3/Q3 than across element S2/Q2 after element S2/Q2 is turned off and either element S1/Q1 or S3/Q3 is turned on.

Figure 7A:
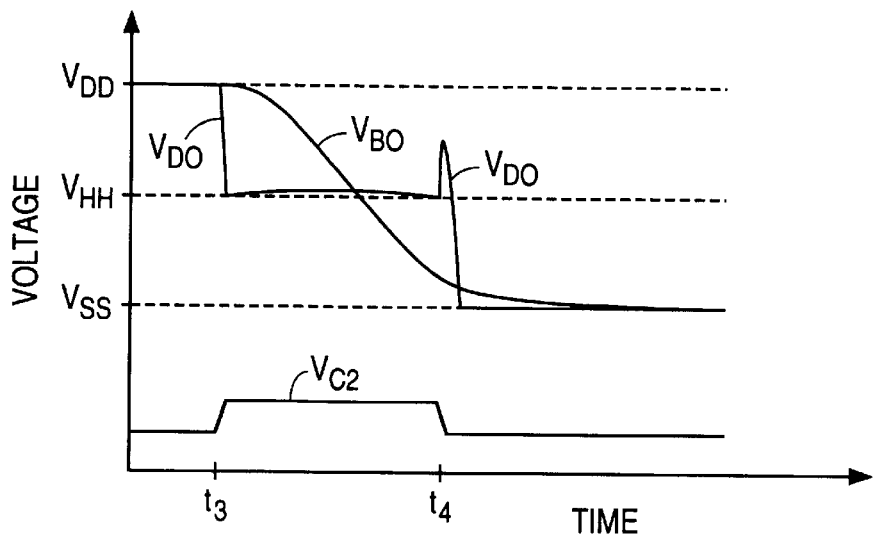
FIGS. 7a, 7b, and 7c are simplified timing diagrams of voltage waveforms that arise in the circuitry of FIGS. 3 and 4 when the timing respectively is too fast, just right, and too slow.
Figure 7B:
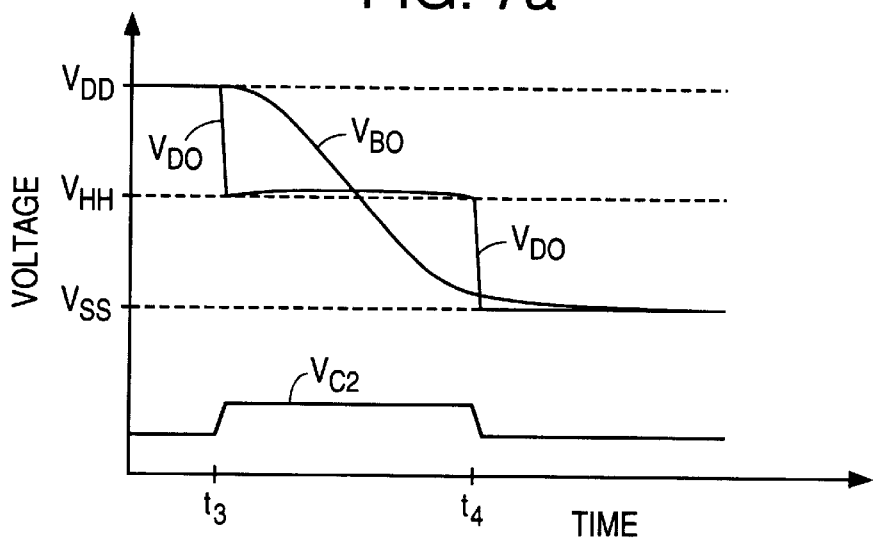
Figure 7C:
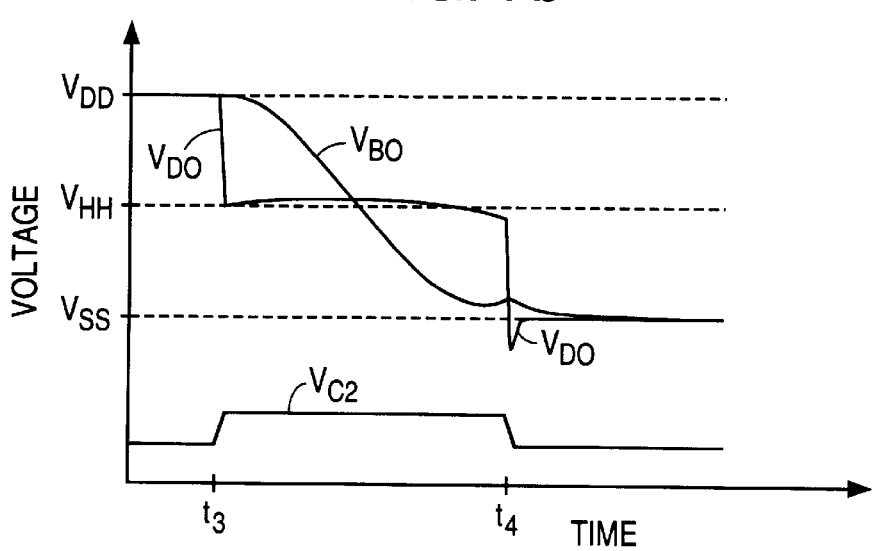

FIGS. 7a–7c present waveforms that provide a foundation for using a technique of the foregoing type to develop the control timing. These three timing diagrams respectively illustrate the cases in which the choice of time $t_4$ in the second half of the operational cycle occurs (a) too early, (b) at the right time, and (c) too late. If time $t_4$ occurs too early, current flows from load 18 through inductance LB when element S2/Q2 is turned off, causing an inductive kick to delay the movement of output driver voltage $V_{DO}$ from $V_{HH}$ to $V_{SS}$ relative to the corresponding transition in control voltage $V_{C2}$. See FIG. 7a. Driver output voltage $V_{DO}$ makes a rapid, unhindered transition from $V_{HH}$ to $V_{SS}$ when time $t_4$ is at the right value as shown in FIG. 7b. If time $t_4$ occurs too late, current flows through inductor LB and to load 14 when element S2/Q2 is turned off. This causes the movement of driver output voltage $V_{DO}$ to be speeded up relative to the corresponding transition in control voltage $V_{C2}$ as indicated in FIG. 7c.

Figure 8:
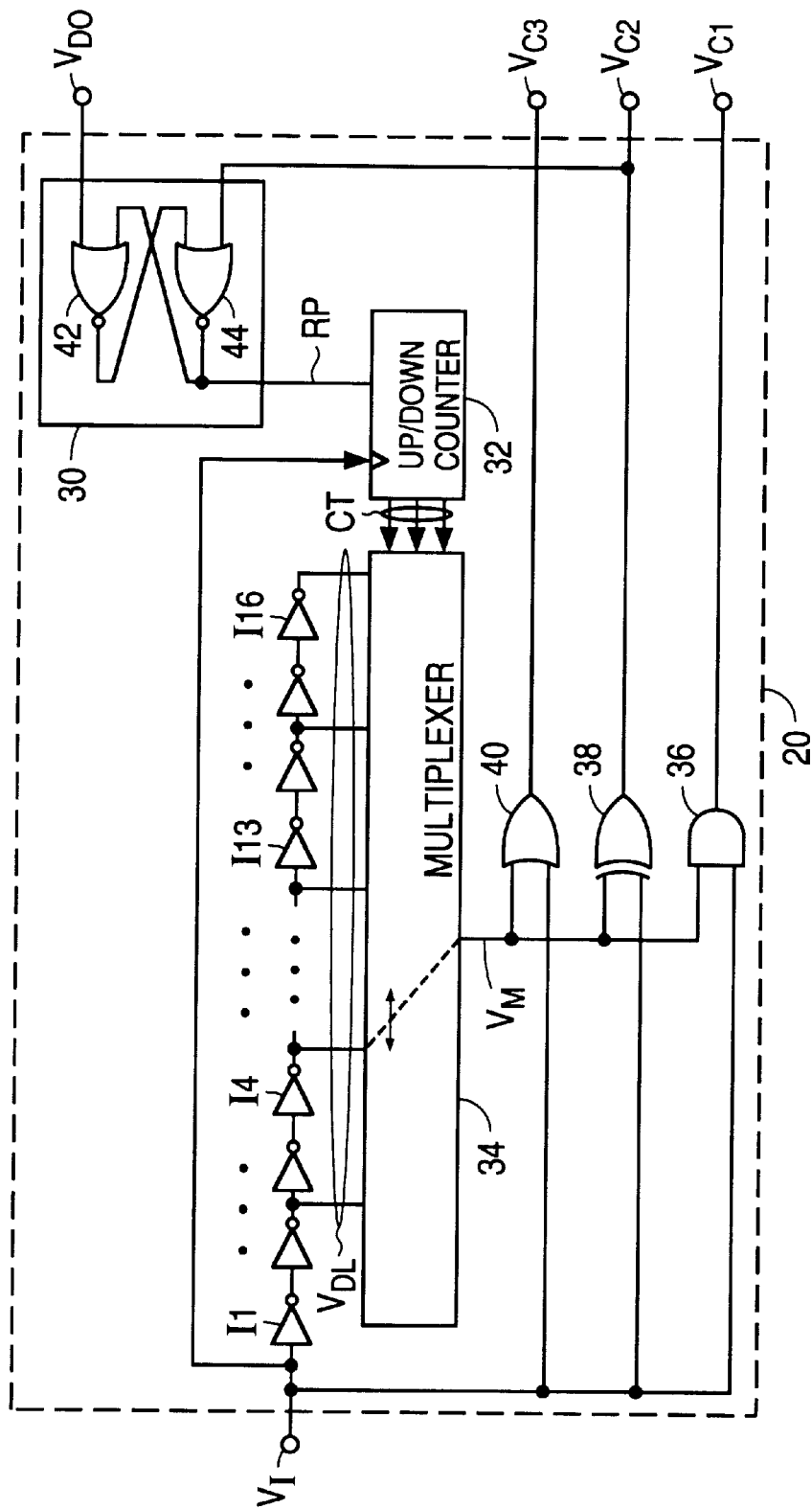
FIG. 8 is a block/circuit diagram of an embodiment of the control circuitry in FIG. 4.

FIG. 8 depicts an implementation of control circuitry 20 that takes advantage of the foregoing to produce control voltages $V_{C1}$–$V_{C3}$, particularly control voltage $V_{C2}$, at substantially optimum times without relying on an a priori external examination of conductor output voltage $V_{BO}$. Control circuitry 20 in FIG. 8 contains a race resolver 30, an up-down counter 32, a multiplexer 34, an AND gate 36, an exclusive OR gate 38, a NOR gate 40, and sixteen CMOS inverters I1, I2, . . . I16 connected as shown. Race resolver 30 is formed with NOR gates 42 and 44 arranged in a cross-connected configuration.

Control circuitry 20 in FIG. 8 operates in the following way. Race resolver 30 provides an output signal RP to up/down counter 32 in response to driver output voltage $V_{DO}$ and control voltage $v_{C2}$. When both of voltages $V_{DO}$ and $V_{C2}$ are low, race resolver 30 can be in one of two stable states depending on which of voltages $V_{DO}$ and $V_{C2}$ went low first. Consequently, the state of resolver 30 immediately after time $t_4$ indicates whether element S2/Q2 was switched off too early or too late. Resolver output signal RP is supplied at a value corresponding to the resolver state.

Up/down counter 32 is sampled on every rising edge of input voltage $V_I$. Resolver output signal RP causes counter 32 to count up one or down one depending on the RP value, and thus depending on whether control voltage $V_{C2}$ went low before driver output voltage $V_{DO}$ went low or vice versa.

If element S2/Q2 was turned off at precisely the right value of time $t_4$ so that resolver 30 is in an indeterminant state, resolver output signal RP is at an arbitrary value. This causes counter 32 to count up one or down one. However, if counter 32 counts downs one as the result of an arbitrary value of signal RP during one cycle, counter 32 will normally count up one during the next cycle, and vice versa.

Inverters I1–I16 form a delay line driven by input voltage $V_I$. Output voltage signals $V_{D1}$ taken from every other one of inverters I1–I16 are supplied as delay input signals to multiplexer 34. Up/down counter 32 provides a count signal CT that determines which of delay signals $V_{D1}$ is supplied from multiplexer 34 as its output voltage signal $V_M$. Consequently, the combination of multiplexer 34 and inverters I1–I16 provide a variable delay controlled by counter 32. Input voltage $V_I$ and multiplexer output voltage $V_M$ are supplied to logic gates 36, 38, and 40. The length of the delay determined by up/down counter 32, and thus by the difference between the times that driver output voltage $V_{DO}$ and control voltage $V_{C2}$ go low, thereby determines the timing of control voltage $V_{C2}$ as well as the timing of control voltages $V_{C1}$ and $V_{C3}$.

Inasmuch as control voltage $V_{C2}$ controls when element S2/Q2 is switched off, driver circuit 18 as embodied with control circuitry 20 in FIG. 8, implements a control loop that adjusts the driver output timing according to the requirements of load 14 on every rising edge of driver input signal $V_I$. After several transitions of input signal $V_I$, driver 18 becomes adjusted to the requirements of load capacitance CL, conductor inductance LB, and conductor capacitance CB to within one increment of the timing provided by inverters I1–I16. This self-adjustment technique avoids the necessity to perform an a priori external examination of conductor output voltage $V_{BO}$.

Figure 9:
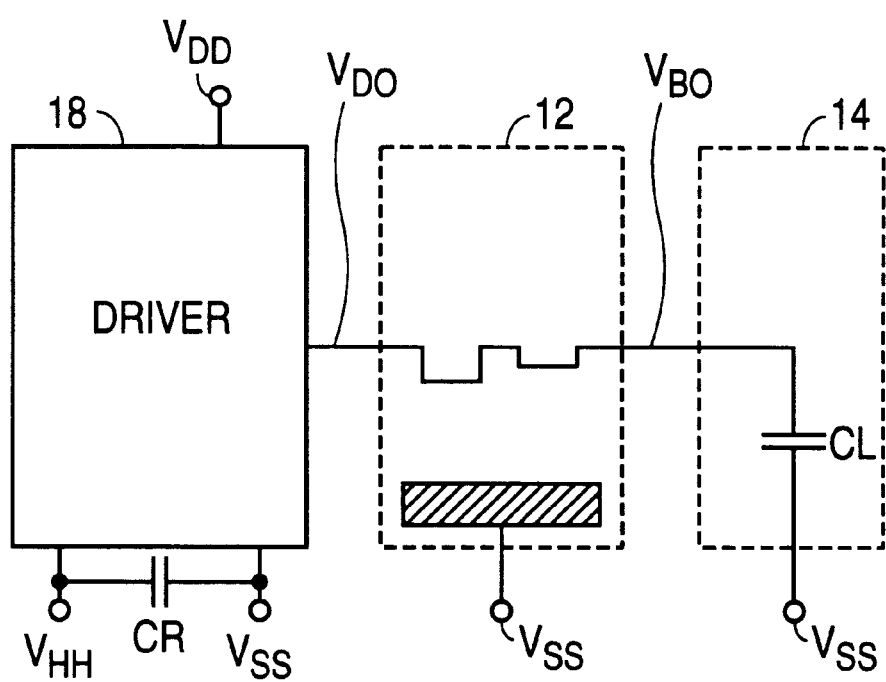
FIG. 9 is a block/circuit diagram indicating how the intermediate supply voltage for the driver circuit of FIG. 3 is provided from a reservoir capacitor.

The time-averaged value of current $I_2$ flowing to and from the $V_{HH}$ supply is approximately zero. Referring to FIG. 9, intermediate voltage $V_{HH}$ may thus be supplied from one plate of a reservoir capacitor CR. The other plate of reservoir capacitor CR is typically connected to the $V_{SS}$ supply. The value of reservoir capacitor CR is at least as large as, preferably larger than, the value of the sum of capacitances CL and CB. In this case, the intermediate level $V_{HH}$ changes throughout a transition due to the current flow into or out of reservoir capacitor CR.

A further method of determining the correct timing for disconnecting element S2/Q2 can be utilized when intermediate voltage $V_{HH}$ is supplied from reservoir capacitor CR. In this case, current $I_2$ flowing to or from reservoir capacitor CR causes its voltage to change in the opposite direction to conductor output voltage $V_{BO}$. The rate of change of voltage across reservoir capacitor CR, and thus also of intermediate voltage $V_{HH}$, is proportional to current $I_2$ flowing into or out of capacitor CR via element S2/Q2. In light of this, an electronic differentiator monitoring the reservoir capacitor voltage can be used to indicate the point of zero current flow. Alternatively, a voltage comparator can be used to detect the point of minimum or maximum voltage deviation of reservoir capacitor CR, corresponding to the point of zero current flow through element S2/Q2 and thus also indicating the correct point to turn off element S2/Q2.

While the invention has been described with reference to particular embodiments, this description is solely for the purpose of illustration and is not to be construed as limiting the scope of the invention claimed below. For example, the number of inverters in control circuit 20 in FIG. 8 could differ from sixteen. Inverters I1–I16 could be replaced with a monostable multivibrator. A control loop for providing self-adjustment of the timing sequence used to generate control voltage $V_{C2}$ along with control voltages $V_{C1}$ and $V_{C3}$, can be implemented in a manner considerably different than that shown for control circuitry 20 in FIG. 8.

Part or all of ICs 16 in FIG. 3 can be connected to PWB conductor 12 at various points along its length so as to produce a distributed load. With capacitance CL representing the parasitic capacitance of the IC input(s) at the end of conductor 12, capacitance CB would be effectively increased while capacitance CL is effectively reduced. Alternatively, conductor 12 can be a branching structure with each branch terminating in one or more of ICs 16. A branching structure for conductor 12 can be combined with a distributed load.

Driver 18 and load 14 could be formed as part of one IC, and conductor 12 could then be an interconnect within that IC. Various modifications and applications may thus be made by those skilled in the art without departing from the true scope and spirit of the invention as defined in the appended claims.

What is claimed is:

1. An electronic driver circuit for generating a circuit output signal providable to an electrical conductor that furnishes a conductor output signal providable to a load, the circuit and conductor output signals respectively making corresponding circuit and conductor output transitions approximately between a pair of output voltage levels between which there is an intermediate voltage level, inductance and capacitance of the conductor and the load producing resonance that enables the conductor output signal to largely complete each conductor output transition while the circuit output signal is being held at approximately the intermediate voltage level for a non-zero intermediate-level holding period during the corresponding circuit output transition.

2. A driver circuit as in claim 1 wherein the circuit output signal rapidly completes each circuit output transition after finishing the intermediate-level holding period of that circuit output transition.

3. A driver circuit as in claim 2 wherein each conductor output transition is largely completed in a duration approximately equal to the intermediate-level holding period of the corresponding circuit output transition.

4. A driver circuit as in claim 1 wherein the intermediate-level holding period is controllable as a function of the circuit output signal.

5. A driver circuit as in claim 1 wherein the intermediate voltage level is substantially constant.

6. A driver circuit as in claim 1 wherein the intermediate voltage level is variable.

7. A driver circuit as in claim 1 wherein, when the conductor connects the load to the circuit, the load is distributed along the conductor.

8. A driver circuit as in claim 1 wherein, when the conductor connects the load to the circuit, the conductor branches into multiple branches for providing the conductor output signal to multiple portions of the load.

9. A driver circuit as in claim 8 wherein the portion of the load for one of the branches is distributed along that branch.

10. A driver circuit as in claim 1 wherein the circuit comprises:
   control circuitry responsive to a circuit input signal for generating a plurality of control signals; and
   switching circuitry responsive to the control signals for generating the circuit output signal.

11. A driver circuit as in claim 10 wherein the circuit output signal rapidly completes each circuit output transition after finishing the intermediate-level holding period of that circuit output transition.

12. A driver circuit as in claim 11 wherein each conductor output transition is largely completed in a duration approximately equal to the intermediate-level holding period of the corresponding circuit output transition.

13. A driver circuit as in claim 10 wherein the circuit is coupled between sources of first, second, and third supply voltages respectively approximately equal to one of the output voltage levels, the intermediate voltage level, and the other of the output voltage levels.

14. A driver circuit as in claim 13 wherein the source of the second supply voltage comprises a reservoir capacitor.

15. A driver circuit as in claim 14 wherein the control circuitry monitors the reservoir capacitor to determine when approximately zero current is flowing into or out of the reservoir capacitor.

16. A driver circuit as in claim 13 wherein the control circuitry terminates the intermediate-level holding period when approximately zero current is flowing into or out of the source of the second supply voltage.

17. A driver circuit as in claim 13 wherein the switching circuitry comprises:

a first switch having (a) a first flow electrode coupled to the source of the first supply voltage, (b) a second flow electrode coupled to an output node from which the circuit output signal is provided, and (c) a control electrode responsive to a first of the control signals for controlling the current flow between the first switch's flow electrodes;

a second switch having (a) a first flow electrode coupled to the source of the second supply voltage, (b) a second flow electrode coupled to the output node, and (c) a control electrode responsive to a second of the control signals for controlling the current flow between the second switch's flow electrode; and a third switch having (a) a first flow electrode coupled to the source of the third supply voltage, (b) a second flow electrode coupled to the output node, and (c) a control electrode responsive to a third of the control signals for controlling current flow between the third switch's flow electrodes.

18. A driver circuit as in claim 17 wherein the circuit output signal rapidly completes each circuit output transition after finishing the intermediate-level holding period of that circuit output transition.

19. A driver circuit as in claim 18 wherein each conductor output transition is largely completed in a duration approximately equal to the intermediate-level holding period of the corresponding circuit output transition.

20. A driver circuit as in claim 17 wherein:

each of the first and third switches comprises a field-effect transistor having a source, a drain, and a gate electrode respectively coupled to the first flow electrode, the second flow electrode, and the control electrode of that switch; and the second switch comprises a field-effect transistor having a first source/drain electrode, a second source/drain electrode, and a control electrode respectively coupled to the first flow electrode, the second flow electrode, and the control electrode of the second switch.

21. A driver circuit as in claim 17 wherein the control circuitry comprises:

time-comparison circuitry for comparing the circuit output signal and the second control signal to determine whether the circuit output signal completes a circuit output transition before the second control signal completes the corresponding control transition; and adjustment circuitry for adjusting the intermediate-level holding period depending on the comparison.

22. A driver circuit as in claim 10 wherein the control circuitry determines the intermediate-level holding period for each circuit output transition as a function of characteristics of at least one previous circuit output transition.

23. A driver circuit as in claim 22 wherein said characteristics are determined from relative timing of two signals.

24. A driver circuit as in claim 1 wherein the load contains digital circuitry.

25. An electronic driver circuit coupled between sources of different first, second, and third supply voltages, the second supply voltage lying between the first and third supply voltages, the circuit comprising:

control circuitry responsive to a circuit input signal for generating different first, second, and third control signals;

a first switch having (a) a first flow electrode coupled to the source of the first supply voltage, (b) a second flow electrode coupled to an output node from which a circuit output signal is provided, and (c) a control electrode responsive to the first control signal for controlling current flow between the first switch's flow electrodes;

a second switch having (a) a first flow electrode coupled to the source of the second supply voltage, (b) a second flow electrode coupled to the output node, and (c) a control electrode responsive to the second control signal for controlling current flow between the second switch's flow electrodes; and a third switch having (a) a first flow electrode coupled to the source of the third supply voltage, (b) a second flow electrode coupled to the output node, and (c) a control electrode responsive to the third control signal for controlling current flow between the third switch's flow electrodes, the circuit output signal making rising and falling circuit output transitions approximately between the first and third supply voltages, the circuit output signal staying approximately at the second supply voltage for a non-zero intermediate-level holding period during each circuit output transition.

26. A driver circuit as in claim 25 wherein:

each of the first and third switches comprises a field-effect transistor having a source, a drain, and a gate electrode respectively coupled to the first flow electrode, the second flow electrode, and the control electrode of that switch; and the second switch comprises a field-effect transistor having a first source/drain electrode, a second source/drain electrode, and a control electrode respectively coupled to the first flow electrode, the second flow electrode, and the control electrode of the second switch.

* * * * *